United States Patent [19]

Kotowski et al.

[11] Patent Number: 5,084,668
[45] Date of Patent: Jan. 28, 1992

[54] SYSTEM FOR SENSING AND/OR CONTROLLING THE LEVEL OF CURRENT IN A TRANSISTOR

[75] Inventors: Jeffrey P. Kotowski, Rolling Meadows; Brian D. Chapman, Gurnee, both of Ill.

[73] Assignee: Motorola, Inc., Schaumburg, Ill.

[21] Appl. No.: 534,996

[22] Filed: Jun. 8, 1990

[51] Int. Cl.$^5$ .............................................. G05F 1/56
[52] U.S. Cl. ................................ 323/315; 323/277; 323/280; 361/93
[58] Field of Search ............. 323/275, 280, 281, 315, 323/277, 285; 361/18, 152, 93

[56] References Cited

U.S. PATENT DOCUMENTS

| | | | |
|---|---|---|---|
| 4,319,181 | 3/1982 | Wrathall | 323/277 |
| 4,437,023 | 3/1984 | Gill, Jr. | 323/315 |
| 4,605,891 | 8/1986 | Wrathall | 323/277 |
| 4,654,602 | 3/1987 | Aoki | 323/315 |
| 4,689,607 | 8/1987 | Robinson | 323/315 |
| 4,703,390 | 10/1987 | Fay et al. | 323/277 |
| 4,750,079 | 6/1988 | Fay et al. | 323/277 |
| 4,965,510 | 8/1990 | Kriedt et al. | 323/315 |
| 5,008,586 | 4/1991 | Miyazaki et al. | 361/93 |
| 5,028,861 | 7/1991 | Pace et al. | 323/285 |

FOREIGN PATENT DOCUMENTS 1118983  10/1989  U.S.S.R. ............... 323/280

*Primary Examiner*—William H. Beha, Jr.
*Attorney, Agent, or Firm*—John H. Moore

[57] ABSTRACT

A transistor sense electrode (20) is coupled to the input branch (24) of a current mirror (22). The current mirror's branch (26) carries a current substantially equal to the current in the input branch to indicate the current flowing in the transistor. A preferred embodiment includes an amplifier (30) which senses the difference between the voltage at the sense electrode (20) and a reference voltage (Vx). The sensed difference in voltage causes the amplifier to apply a control signal to the current mirror to vary the current in the input branch so as to hold the sense electrode's voltage at the level of the reference voltage (Vx). A preferred package for the system's circuitry is also disclosed.

13 Claims, 2 Drawing Sheets

SYSTEM FOR SENSING AND/OR CONTROLLING THE LEVEL OF CURRENT IN A TRANSISTOR

FIELD OF THE INVENTION

This invention is directed toward electronic circuitry for sensing the level of current flow in a transistor, and for optionally using the same sensing circuitry to regulate the flow of current in the same transistor.

BACKGROUND OF THE INVENTION

A "Sense FET" is an example of the type of transistor with which this invention is most advantageously used. Such a transistor typically includes at least two transistors connected in parallel within the same package, with a common drain electrode, a common gate electrode, and two source electrodes. One source electrode usually carries a relatively high level of load current, while the other source electrode (referred to herein as the sense electrode) carries a relatively lower level of current that is a known fraction of the load current. By sensing the current carried by the sense electrode, one can determine the level of the load current.

Sensing the current carried by the sense electrode is conventionally accomplished by placing a resistor (the sense resistor) in series with the sense electrode, and measuring the voltage drop across the sense resistor. While this technique is adequate for some applications, it is not entirely satisfactory for situations where higher accuracy is desired. The lack of accuracy in the conventional technique arises because the voltage drop across the sense resistor results in unequal gate-to-source voltages between the transistor carrying the sense current and the transistor carrying the load current. If the inequality between the gate-to-source voltages is more than about 300 millivolts, the sense current will be more or less than the desired percentage of the load current.

OBJECTS OF THE INVENTION

It is a general object of the invention to provide an improved system for sensing the level of current in a transistor that has a current sense electrode.

It is a more specific object of the invention to provide such a system which is more accurate than conventional systems, and which can be optionally used to also regulate the flow of current in the transistor.

DESCRIPTION OF THE PREFERRED EMBODIMENT

Figure 1:
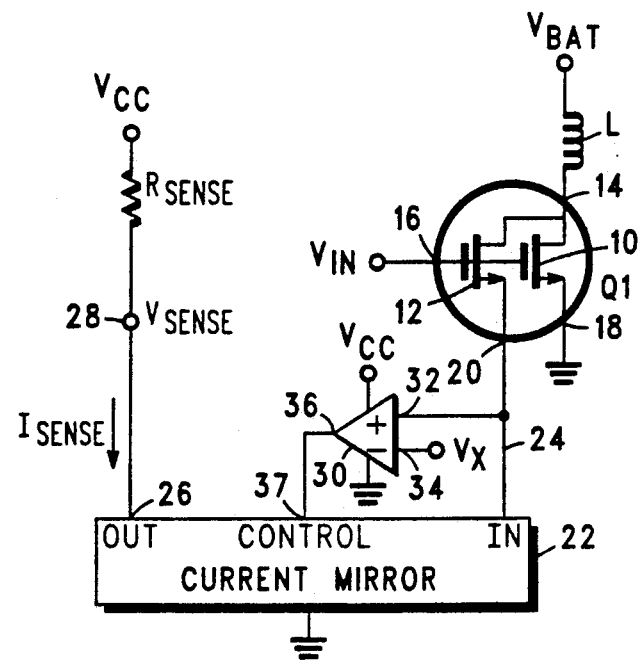
FIG. 1 illustrates a current sensing system according to the invention.

Referring now to FIG. 1, a transistor Q1 is shown which is typical of the type of transistor whose current can be sensed and optionally regulated according to the invention. As shown, the transistor Q1 is a Sense FET having a pair of internal transistors 10 and 12. The drains of these two transistors are coupled to a common drain electrode 14, and their gates are coupled to a common gate electrode 16 which receives an input voltage Vin for turning the transistor Q1 off and on. With the illustrated arrangement, the transistor 10 is the load carrying transistor. Its current flows through a load L and the drain electrode 14, through the transistor 10, and from there to ground via its source electrode 18. The transistor 12 carries a predetermined fraction of the load current due to its predetermined size relationship to the transistor 10. Hence, a predetermined fraction of the load current flows through the transistor 12 and exits the transistor Q1 via a sense electrode 20. The current flowing from the sense electrode 20 is the current which the present invention senses and/or regulates without disrupting the predetermined ratio between the level of current carried by the transistors 10 and 12.

The illustrated system uses a current mirror 22 that has an input branch 24 and an output branch 26. As is known in the art and as used herein, the term "current mirror" means an electronic circuit which receives a current at an input port or branch, and generates a matching current in an output port or branch. In this case, the current mirror 22 receives the current flowing from the sense electrode 20 and mirrors that current in its output branch 26. Thus, the current $I_{sense}$ flowing in the output branch 26 is preferably identical, or nearly identical, to the current flowing in the input branch 24. Alternatively, the current $I_{sense}$ in the output branch 26 may bear a predetermined ratio to the current flowing in the input branch 24.

To convert the current $I_{sense}$ to a signal ($V_{sense}$) that is representative of the level of current flowing in the output branch 26, any appropriate impedance may be coupled to the output branch 26. In the illustrative embodiment, a resistor $R_{sense}$ is coupled between a supply voltage $V_{cc}$ and the output of the current mirror. Thus a voltage $V_{sense}$, indicative of the current in the branch 26 and also, of course, indicative of the level of current flowing in the transistor $Q_1$, is developed at a node 28.

As briefly discussed above, it is important that the gate-to-source voltages associated with the transistors 10 and 12 be substantially equal, or that any difference between them be held to roughly 300 millivolts or less. For this purpose, the illustrated embodiment includes means, preferably in the form of a amplifier 30, that is coupled to the current mirror 22 and to the sense electrode 20 for holding the voltage at the sense electrode substantially equal to a predetermined reference voltage, despite variations in transistor current. As shown, the amplifier 30 has a non-inverting input 32 that is coupled to the sense electrode 20 via the input branch 24. It also has an inverting input 34 that is coupled to a predetermined reference voltage $V_x$. Preferably, $V_x$ is selected to be the upper limit on the level to which the voltage on the sense electrode is allowed to rise and, as stated previously, will normally be under 300 millivolts. A $V_x$ of 250 millivolts is believed to be a practical selection for the value of $V_x$.

The amplifier 30 also has an output 36 which is coupled to a control input 37 of the current mirror 22. The signal applied to the control input changes the level of current in the input branch 24 in response to sensed differences between the voltage at the sense electrode 20 and the reference voltage $V_x$. Any such change in the level of current in the input branch 24 results, of course, in a similar change in the level of the current $I_{sense}$ flowing in the output branch 26. By thus varying the level of current flowing in the input branch 24, the voltage at the sense electrode 20 is forced to be equal to, or substantially equal to, the reference voltage $V_x$. The way in which the amplifier 30 and the current mirror 22 achieve this result is best explained with reference to FIG. 2 which shows a preferred embodiment of the current mirror 22 and the amplifier 30.

Figure 2:
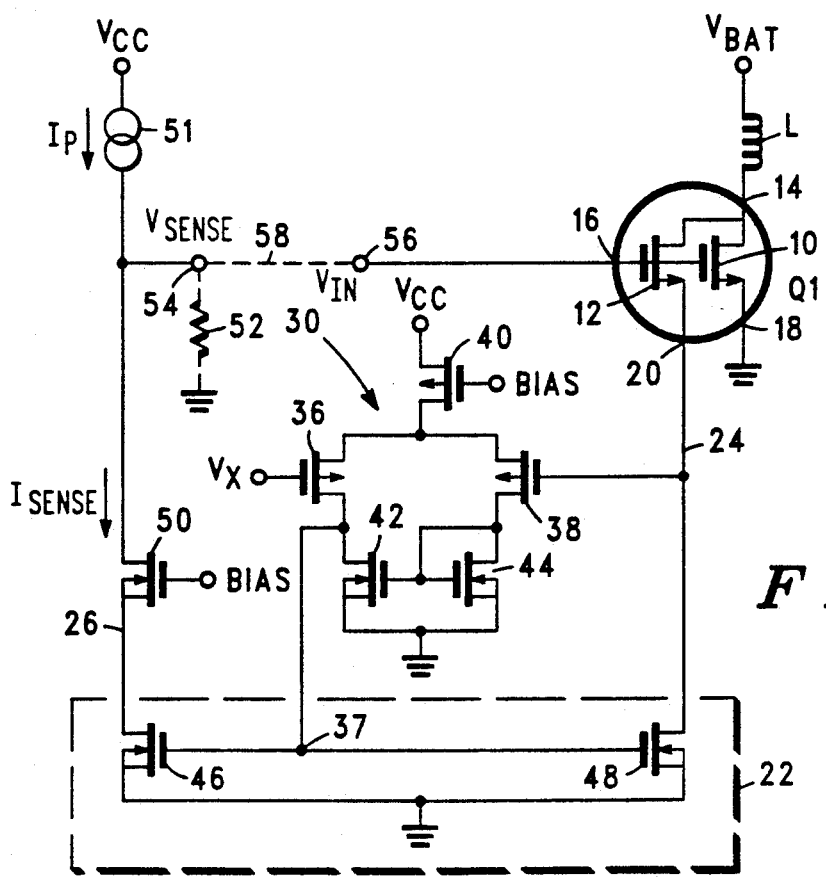
FIG. 2 shows details of a preferred amplifier and current mirror for use with the invention, and additionally illustrates how to use the current sensing system to regulate the level of current flowing in the transistor in which current is being sensed.

In the embodiment of FIG. 2, the amplifier 30 is illustrated as comprising five transistors, wherein transistors 36 and 38 are coupled together in a differential arrangement so that the gate electrode of transistor 36 receives the reference voltage $V_x$ and the gate electrode of the transistor 38 receives the voltage from the sense electrode 20. The drains of these two transistors are coupled together and are coupled to the source of another transistor 40 whose drain is connected to the power supply. The gate electrode of the transistor 40 receives an appropriate bias.

The sources of transistors 36 and 38 are coupled to the drains of another pair of transistors 42 and 44 whose gates are tied together and whose sources are both coupled to ground. The drain electrode of the transistor 44 is tied directly to its own gate, and the drain electrode of the transistor 42 is coupled to the control input 37 of the current mirror 22.

The current mirror 22 is a conventional arrangement that includes transistors 46 and 48. The sources of these two transistors are coupled directly to ground and their gate electrodes are coupled directly to each other and to the control input 37. The drain electrode of the transistor 48 receives the current from the sense electrode 20 via the input branch 24, and the drain electrode of the transistor 46 is coupled directly to the output branch 26. With this arrangement, any deviation in the voltage at the sense electrode 20 from the value of the reference voltage $V_x$ results in the generation of a signal at the current mirror's control input 37 which varies the bias on the gate electrodes of the transistors 46 and 48. This causes a change in the current in the input branch 24 which moves the value of the voltage at the sense electrode 20 toward the value of the reference voltage $V_x$. A similar change occurs in the level of current flowing in the output branch 26. Thus, the voltage of the sense electrode 20 is held at or near the value of the reference voltage $V_x$. Since $V_x$ is, in this embodiment, only 250 millivolts, the gate-to-source voltages of the transistors 10 and 12 are held close enough to each other so that the current in the transistor 12 remains at a predetermined percentage of the current in the transistor 10. Consequently, the current flowing in the output branch 26 is also a predetermined percentage of the current flowing in the transistor 10.

An optional transistor 50 may be included in the output branch 26 in order to isolate the current mirror 22 from circuitry which is coupled to the output branch 26. In effect, this provides a higher output impedance for the current mirror 22.

As mentioned previously, the embodiment of FIG. 2 may also be used to regulate the level of current flowing in Q1. For this purpose, the output branch 26 is coupled via the transistor 50 to a conventional current source 51 that generates a predetermined level of current Ip. The value of Ip is selected to be equal to the value of current attained by the transistor 12 when the load current in transistor 10 reaches a desired upper limit. For example, if it is desirable to limit the load current to 1 ampere, and the current in the transistor 10 is nominally 1000 times greater than the current in the transistor 12, then Ip is selected to be 1 milliampere.

As the current in the transistor 10 starts to exceed 1 ampere, the current in the input branch 24 and in the output branch 26 will begin to exceed 1 milliampere. At this point, the current $I_{sense}$ in the output branch 26 exceeds the level of Ip. Because of parasitic impedance 52 between node 54 and ground, the level of $V_{sense}$ is pulled low. This change in $V_{sense}$ signals that the load current has reached its upper design limit of 1 ampere, whereupon Vin at the input (gate) electrode (node 56) of Q1 can be reduced to turnoff Q1 or to hold its load current at the 1 ampere level.

To automatically hold the load current at the desired level, a connector 58 (shown in dashed lines), or any other suitable means, may couple the node 54 to the node 56. Thus, any deviation (up or down) in the value of $I_{sense}$ from the value of Ip results in a change in the value of $V_{sense}$ and Vin. This change is in the proper direction to hold the current in transistor 12 at the level of Ip, thereby holding the load current at its desired level.

Figure 3:
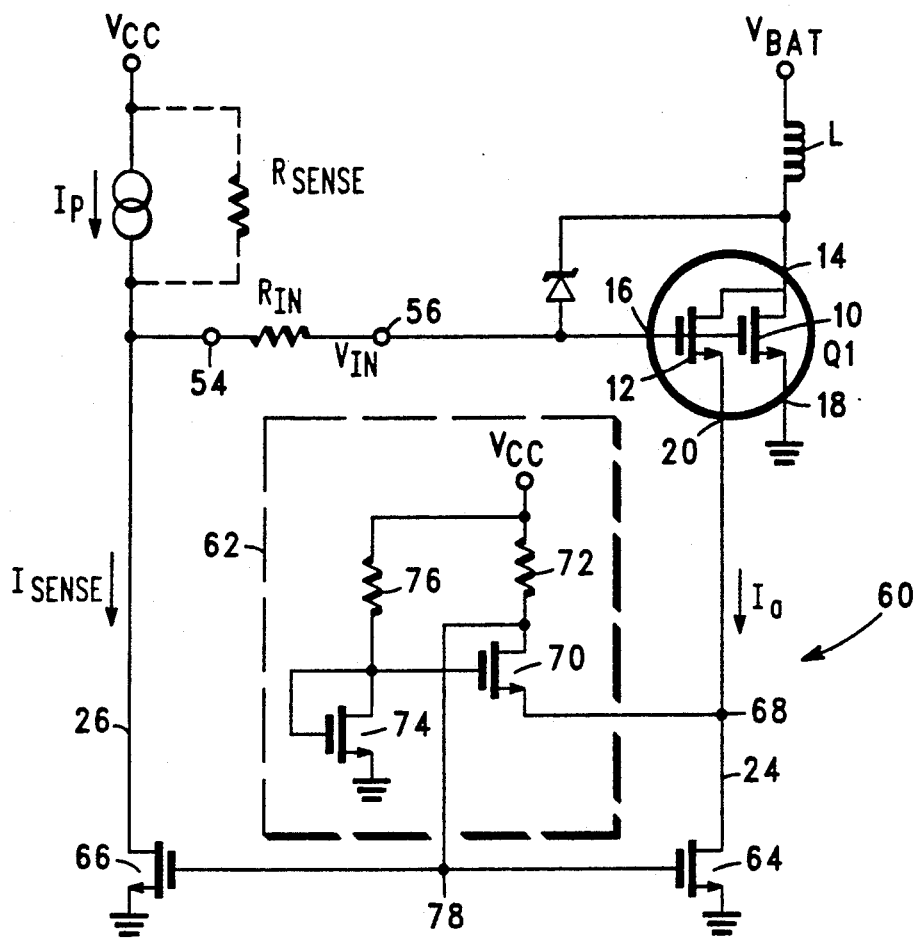
FIG. 3 shows another embodiment of the invention.

Referring now to FIG. 3, another embodiment of the invention is shown which is capable of either sensing the current in the Sense FET Q1 or controlling the level of current which it conducts. This illustrated embodiment is essentially the same as those shown in FIGS. 1 and 2 except that the embodiment in FIG. 3 uses a different amplifier unit 62, and all the transistors shown in this embodiment are N channel devices.

The current mirror in this embodiment includes a pair of transistors 64 and 66, with the drain of the transistor 64 coupled to the input branch 24 of the current mirror, while the drain of the transistor 66 is connected to the output branch 26 of the current mirror. The amplifier unit 62 is coupled to the sense electrode 20 of transistor Q1 via a node 68 and, as discussed more fully below, operates to hold the voltage at the node 68 to a level of about 200 to 300 millivolts.

When the FIG. 3 embodiment is used to control the level of current Ia received from the sense electrode 20, a resistor Rin may be coupled between the nodes 54 and 56. A current source Ip is coupled to the node 54 as illustrated. With this arrangement, the illustrated circuitry holds the current Ia at the level of the current Ip, at least in the steady state condition. In this mode of operation, the amplifier unit 62 holds the voltage at the node 68 at a low level as will be described later.

The embodiment in FIG. 3 can also be used to sense the level of the current Ia (as opposed to controlling this level) by removing the resistor Rin between the nodes 54 and 56, by replacing the current source Ip with a resistor $R_{sense}$ (shown in dotted lines), and by applying an input voltage Vin at the node 56 to turn the transistor Q1 selectively on and off. With this modification, the amplifier unit 62 again maintains the voltage at the node 68 at a low predetermined level, while the current Ia is mirrored to form a nearly identical current $I_{sense}$ in the output branch 26. This current flows through the resistor $R_{sense}$ so that its level may be sensed at the node 54.

It can be seen that the overall operation of the circuitry shown in FIG. 3 is essentially identical to the operation of the circuitry previously described with reference to FIGS. 1 and 2. At this point, the operation of the amplifier unit 62 will now be explained.

An N channel transistor 70 has its source electrode directly coupled to the node 68, its drain electrode coupled through a relatively large valued resistor 72 to $V_{cc}$, and its gate electrode coupled to another N channel transistor 74. The latter transistor has its drain coupled to its gate and to the gate of the transistor 70. A resistor 76 is coupled between $V_{cc}$ and the drain of the transistor 74 so that the combination of the resistor 76 and the transistor 74 provides a bias voltage for the transistor 70.

The illustrated configuration of the transistor 70 essentially provides a source follower for the voltage appearing at the node 68. That voltage is amplified by the transistor 70 and fed back to the current mirror at node 78, thereby to control the level of conduction of the transistors 64 and 66.

The amplifier unit 62 also develops a reference voltage, and it holds the voltage at the node 68 essentially to that reference voltage. This reference voltage is equal to the bias voltage applied to the gate of the transistor 70 minus the threshold hold ($V_t$) of the transistor 70, minus the Vdsat of the transistor 70. The amplifier unit 62 operates in conjunction with the current mirror in a feedback mode to hold the voltage at the node 68 substantially equal to the value of that reference voltage. For example, a momentary increase in the voltage at the node 68 is sensed and amplified by the transistor 70 to produce a larger increase in voltage at the drain of the transistor 70, thereby turning on the transistor 64 harder. The increased conduction of the transistor 64 tends to lower the voltage at the node 68. With this arrangement, the amplifier unit 62 allows the overall system to respond to a very low voltage at the node 68 because that voltage is amplified by the amplifying unit 62 to hold the voltage at the node 68 to the predetermined reference level.

In a practical realization of this circuitry, the transistors 64 and 66 should remain in a saturated condition. This means that the voltage at the node 68 should be held to a level that is greater than the Vdsat of the transistors 64 and 66. Additionally, the transistors 64, 70 and 74 are sized such that the Vdsat of transistor 64, plus the Vdsat of the transistor 70, are equal to or less than the Vdsat of the transistor 74. To ensure that this condition prevails, the value of the resistor 76 will typically be selected to be 1/5 the value of the resistor 72 to ensure that the current through the transistor 74 is 5 or more times the value of the current through the transistor 70.

Figure 4:
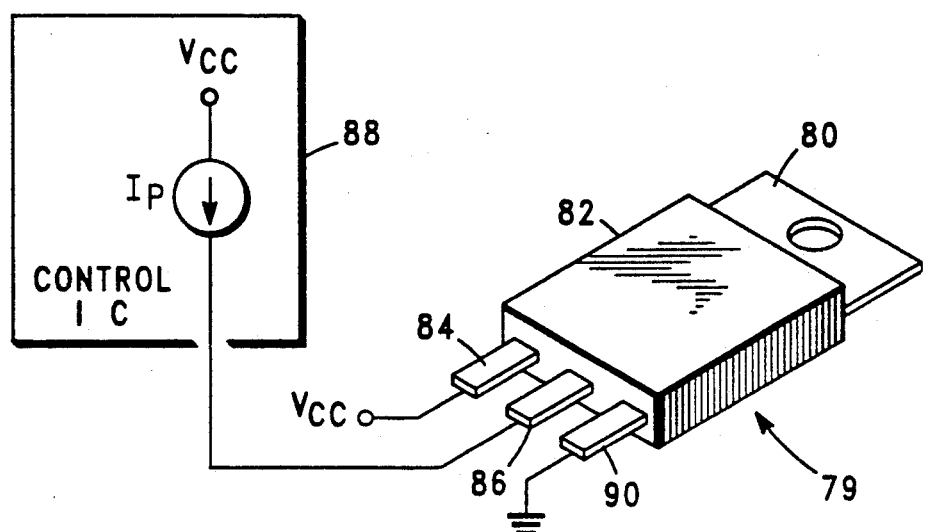
FIG. 4 illustrates a preferred technique for including the embodiment of FIG. 3 in a conventional 3-pin IC package.

A significant advantage of the circuitry shown in FIG. 3 is that it may be conveniently packaged in a conventional transistor package 79 as shown in FIG. 4. This IC package 79 includes a conventional heat sink tab 80. But when the circuitry of the present invention is used in the package 79, the load current is easily limited to a safe level so that excessive power dissipation does not occur. Consequently, the tab 80 need not be affixed to a larger heat radiator. Instead, it can be advantageously used as a signal output port.

For example, with the circuitry of FIG. 3 contained within the segment 82 of the package 79, one of the input leads 84 may be coupled to the power input $V_{cc}$, another of the leads 86 (corresponding to node 56 in FIG. 3) could receive the input current Ip from a control integrated circuit 88, and the third pin 90 could provide the reference voltage (e.g. ground) for the circuitry within the package. Because the dissipation of Q1 (FIG. 3) is limited, it does not require a heat sink that is affixed to large radiator. Hence, the conventional heat sink tab 80 on this package may be used as the output port which is coupled to the illustrated load. Thus, the drain electrodes associated with the transistor Q1 (FIG. 3) would be coupled directly to the heat sink tab 80. This arrangement of a typical 3 pin integrated circuit package with a heat sink tab may now be conveniently used as a 4 pin package without any change and without the expense normally associated with increasing the number of pins for a conventional IC package.

Although the invention has been described in terms of preferred embodiments, it will be obvious to those skilled in the art that various alternations and modifications may be made without departing from the invention. Accordingly, it is intended that all such alternations and modifications be considered as within the spirit and scope of the invention as defined by the appended claims.

What is claimed is:

1. A system for sensing current in a transistor that has an input electrode, an output electrode and a current sense electrode, the system comprising:
   a current mirror having an input branch and an output branch;
   first means coupling the current mirror's input branch to the sense electrode of the transistor, thereby to establish, in the current mirror's input and output branches, currents corresponding to the current flowing from the transistor's sense electrode;
   second means coupled to the current mirror and to the sense electrode for holding the voltage at the sense electrode substantially equal to a predetermined reference voltage, despite variations in transistor current; and
   means coupled to the current mirror's output branch for generating a signal that is representative of the level of current flowing in the output branch.

2. A system as set forth in claim 1 wherein said second means includes an amplifier for sensing any difference between the reference voltage and the voltage at the sense electrode.

3. A system as set forth in claim 2 wherein the current mirror includes a control input for varying the level of current in the input branch of the current mirror, and wherein the amplifier has an output coupled to the current mirror's control input so as to modify the level of current in the current mirror's input branch in response to sensed differences between the voltage at the sense electrode and the reference voltage.

4. A system as set forth in claim 1 wherein said second means includes an amplifying unit that generates the reference voltage and that also amplifies differences between the reference voltage and the voltage at the sense electrode.

5. A system as set forth in claim 4 further including an IC package having input/output pins and a heat sink tab, wherein the transistor's output electrode is coupled to the heat sink tab so as to use the heat sink tab as a signal output port, wherein the transistor's input electrode is coupled to one of the input/output pins, and wherein two of the input/output pins are adapted to be coupled to ground and to a power supply potential, respectively.

6. A system for sensing current in a transistor that has a current sense electrode, the system comprising:
   a current mirror having an input branch, an output branch, and a control input;

means coupling the current mirror's input branch to the sense electrode of the transistor, thereby to establish, in the current mirror's input and output branches, currents corresponding to the current flowing from the transistor's sense electrode;

means for sensing the difference between the voltage at the sense electrode and a reference voltage, and being coupled to the current mirror so as to vary the level of current in the current mirror's input branch to reduce the sensed difference between the voltage at the sense electrode and the reference voltage; and means coupled to the current mirror's output branch for generating a sense signal that is representative of the level of current flowing in the output branch.

7. A system as set forth in claim 6 wherein the transistor has an input electrode, and further including means for coupling the sense signal to the transistor's input electrode.

8. A system for controlling current in a transistor that has at least an input electrode and a sense electrode, the system comprising:

a current mirror having an input branch and an output branch;

first means coupling the current mirror's input branch to the transistor's sense electrode;

second means coupled to the current mirror and to the sense electrode for holding the voltage at the sense electrode substantially equal to a predetermined reference voltage, despite variations in transistor current; and coupling means for coupling the current mirror's output branch to the transistor's input electrode.

9. A system as set forth in claim 8 wherein said second means includes an amplifying unit that generates the reference voltage and that also amplifies differences between the reference voltage and the voltage at the sense electrode, the amplifying unit having an output coupled to the current mirror to vary the current therein.

10. A system as set forth in claim 8 wherein said second means includes a differential amplifier for sensing the difference between the reference voltage and the voltage at the sense electrode.

11. A system as set forth in claim 10 wherein the current mirror includes a control input for varying the level of current in the input branch of the current mirror, and wherein the differential amplifier has an output coupled to the current mirror's control input so as to modify the level of current in the current mirror's input branch in response to sensed differences between the voltage at the sense electrode and the reference voltage.

12. A system as set forth in claim 8 further including a current source coupled to the output branch for directing a known level of current Ip toward said coupling means, thereby to generate, at the junction of the coupling means and the output branch, a voltage indicative of a difference between the level of Ip and the level of current in the output branch.

13. A system for sensing current in a transistor that has an input electrode, an output electrode and a current sense electrode, the system comprising:

a load coupled to the transistor's output electrode;

a current mirror having a control input terminal, an input branch and an output branch; the input branch being coupled to the sense electrode of the transistor, and the output branch carrying a current corresponding to the current in the input branch;

means coupled to the current mirror's output branch for generating a signal that is representative of the level of current flowing in the output branch; and an amplifier unit generating a reference voltage, the amplifier unit being coupled to the sense electrode and to the control terminal of the current mirror to sense differences between the reference voltage and the voltage at the sense electrode and to apply a signal to the control terminal for varying the current in the input branch to thereby hold the value of the voltage at the sense electrode substantially equal to the value of the reference voltage.

* * * * *